United States Patent
Jin et al.

(10) Patent No.: US 9,295,161 B2
(45) Date of Patent: Mar. 22, 2016

(54) METHOD OF FORMING ELECTRIC WIRING USING INKJET PRINTING AND INKJET PRINTING APPARATUS

(71) Applicant: Samsung Electronics Co., Ltd., Suwon-Si, Gyeonggi-Do (KR)

(72) Inventors: Yong-wan Jin, Seoul (KR); Joong-hyuk Kim, Seoul (KR); Young-ki Hong, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 33 days.

(21) Appl. No.: 13/890,360

(22) Filed: May 9, 2013

(65) Prior Publication Data

US 2014/0141155 A1 May 22, 2014

(30) Foreign Application Priority Data

Nov. 22, 2012 (KR) .................. 10-2012-0133148

(51) Int. Cl.
*H05K 3/00* (2006.01)
*H05K 3/12* (2006.01)

(52) U.S. Cl.
CPC .............. *H05K 3/1258* (2013.01); *H05K 3/125* (2013.01); *H05K 2201/09036* (2013.01); *H05K 2203/013* (2013.01); *H05K 2203/0783* (2013.01); *H05K 2203/1476* (2013.01); *H05K 2203/308* (2013.01)

(58) Field of Classification Search
CPC ............. B41N 1/003; H05K 2203/013; H05K 2201/0257; H05K 3/4664; H05K 1/097; H05K 1/092; H05K 3/125; H05K 3/1241; H05K 3/381; C04B 41/009; C23C 22/83; C23C 22/78
USPC ............................. 427/98.4, 96.1, 97.3, 466
See application file for complete search history.

(56) References Cited

U.S. PATENT DOCUMENTS

| | | | |
|---|---|---|---|
| 5,194,294 A * | 3/1993 | Rotman et al. | 427/99.4 |
| 7,569,465 B2 | 8/2009 | Chen et al. | |
| 8,008,105 B2 | 8/2011 | Huang | |
| 2005/0259139 A1 | 11/2005 | Niiya | |
| 2006/0159838 A1* | 7/2006 | Kowalski et al. | 427/58 |
| 2008/0052904 A1* | 3/2008 | Schneider et al. | 29/846 |
| 2008/0153252 A1 | 6/2008 | Liu et al. | |
| 2009/0027760 A1* | 1/2009 | Wang | G02B 26/005 359/291 |

FOREIGN PATENT DOCUMENTS

| | | |
|---|---|---|
| JP | 4014588 B2 | 11/2007 |
| KR | 20090100186 A | 9/2009 |
| KR | 10-2014-0065991 A | 5/2014 |

* cited by examiner

*Primary Examiner* — David Turocy
*Assistant Examiner* — Mohammad Mayy
(74) *Attorney, Agent, or Firm* — Harness, Dickey & Pierce, P.L.C.

(57) ABSTRACT

A method of forming an electric wiring includes forming a trench on a substrate and ejecting first ink and second ink into the trench. The second ink contains a conductive material. The method includes heating the substrate to sinter the second ink such that a tunnel is formed in a lower portion of the trench by evaporation of the first ink, and the conductive material forms the electric wiring in an upper portion of the trench.

10 Claims, 6 Drawing Sheets

METHOD OF FORMING ELECTRIC WIRING USING INKJET PRINTING AND INKJET PRINTING APPARATUS

CROSS-REFERENCE TO RELATED APPLICATIONS

This application claims the benefit of Korean Patent Application No. 10-2012-0133148, filed on Nov. 22, 2012, in the Korean Intellectual Property Office, the disclosure of which is incorporated herein in its entirety by reference.

BACKGROUND

1. Field

At least one example embodiment relates to methods for forming an electric wiring using an inkjet printing, and/or inkjet printing apparatuses.

2. Description of Related Art

In general, an inkjet printing apparatus is an apparatus for printing a predetermined image by ejecting micro-droplets of ink to a desired location on a printing medium through a nozzle of an inkjet head. In recent years, methods of forming electric wiring having a fine line width of about 1-50 μm by ejecting functional ink using an inkjet printing apparatus have been studied. Such an electric wiring has been applied to a flat panel display field such as liquid crystal displays (LCDs), Organic Light Emitting Devices (OLEDs), etc., a flexible display field such as electronic paper (e-paper), etc., and an Organic Thin Film Transistor (OTFT) field, in addition to a simple electric circuit.

SUMMARY

At least one example embodiment provides methods for forming an electric wiring using an inkjet printing, and/or inkjet printing apparatuses.

According to at least one example embodiment, a method of forming an electric wiring includes forming a trench on a substrate and ejecting first ink and second ink into the trench. The second ink may contain a conductive material. The method may further include heating the substrate to sinter the second ink such that, a tunnel is formed in a lower portion of the trench by evaporation of the first ink, and the conductive material forms the electric wiring in an upper portion of the trench.

According to at least one example embodiment, the first ink is immiscible with the second ink.

According to at least one example embodiment, an evaporation temperature of the first ink is higher than a sintering start temperature of the second ink and is lower than a sintering end temperature of the second ink.

According to at least one example embodiment, the second ink has a sintering temperature ranging from 100° C. to 500° C.

According to at least one example embodiment, the ejecting of the first ink and the second ink comprises ejecting the first ink in the trench, and ejecting the second ink on the first ink.

According to at least one example embodiment, the heating the substrate includes a first sintering operation to sinter the second ink such that pores are generated in the second ink and the second ink adheres to an upper wall of the trench, and a second sintering operation to sinter the second ink such that the first ink in the lower portion of the trench evaporates and discharges through the pores.

According to at least one example embodiment, the heating further includes a third sintering operation to sinter the second ink such that the pores formed in the second ink are removed to form the electric wiring in the upper portion of the trench.

According to at least one example embodiment, the ejecting of the first ink and the second ink comprises ejecting the second ink in the trench, and ejecting the first ink on the second ink.

According to at least one example embodiment, the heating the substrate includes a first sintering operation to sinter the second ink such that pores are generated in the second ink to allow the first ink to flow down into the lower portion of the trench through the pores, and a second sintering operation to sinter the second ink such that the second ink adheres to an upper wall of the trench and the first ink in the lower portion of the trench evaporates and discharges through the pores.

According to at least one example embodiment, the heating the substrate further includes a third sintering operation to sinter the second ink such that the pores formed in the second ink are removed to form the electric wiring in the upper portion of the trench.

According to at least one example embodiment, the method further comprises planarizing an upper surface of the electric wiring after the heating of the substrate.

According to at least one example embodiment, the first ink and the second ink are ejected by an inkjet printing method.

According to at least one example embodiment, the forming the trench includes patterning the substrate by a dry etching using a photolithography method.

According to at least one example embodiment, the conductive material comprises metal nanoparticles.

According to at least one example embodiment, an ink jet printing apparatus comprises a first inkjet head configured to eject first ink droplets into a trench formed on a substrate and a first ink chamber configured to supply the first ink to the first inkjet head. The ink jet apparatus may further include a second inkjet head configured to eject second ink droplets into the trench and a second ink chamber configured to supply second ink to the second inkjet head. The second ink may include a conductive material.

According to at least one example embodiment, the first inkjet head and the second inkjet head are configured to perform a printing operation while moving along the trench.

According to at least one example embodiment, the first inkjet head is configured to eject the first ink into the trench and second inkjet head is configured to eject the second ink on the first ink.

According to at least one example embodiment, the second inkjet head is configured to eject the second ink into the trench and the first inkjet head is configured to eject the first on the second ink.

Additional aspects will be set forth in part in the description which follows and, in part, will be apparent from the description, or may be learned by practice of example embodiments.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF EXAMPLE EMBODIMENTS

Example embodiments will be understood more readily by reference to the following detailed description and the accompanying drawings. The example embodiments may, however, be embodied in many different forms and should not be construed as being limited to those set forth herein. Rather, these example embodiments are provided so that this disclosure will be thorough and complete. In at least some example embodiments, well-known device structures and well-known technologies will not be specifically described in order to avoid ambiguous interpretation.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Figure 1:
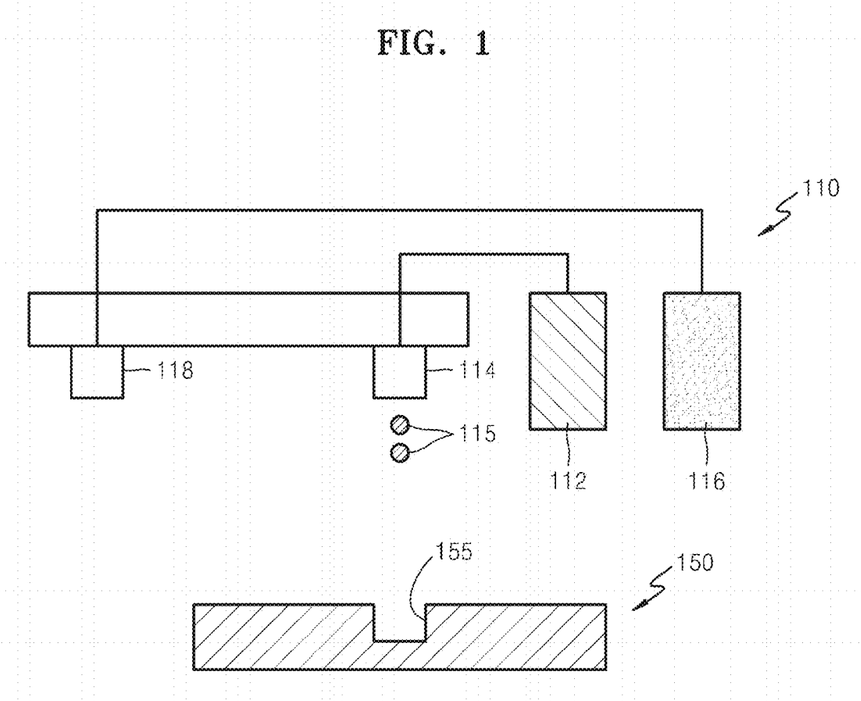
FIG. 1 illustrates an inkjet printing apparatus performing a printing operation on a substrate according to at least one example embodiment.

FIG. 1 illustrates an inkjet printing apparatus 110 performing a printing operation on a substrate 150 according to at least one example embodiment.

Referring to FIG. 1, the inkjet printing apparatus 110 forms an electric wiring structure including a tunnel (see 180 of FIG. 9) in a trench 155 formed on the substrate 150, as will be described below. The inkjet printing apparatus 110 is movably installed on the substrate 150 where an intended a printing operation is to occur. The inkjet printing apparatus 110 includes a first inkjet head 118, which may eject ink used to form a tunnel, a first ink chamber 116, a second inkjet head 114, and a second ink chamber 112. The first inkjet head 118 is supplied with ink for forming of the tunnel from the first ink chamber 116 to eject first ink droplets (see 117 of FIG. 5) for forming of the tunnel in the trench 155 of the substrate 150. The second inkjet head 114 is supplied with second ink from the second ink chamber 112 to eject second ink droplets 115 in the trench 155. The second ink 160 may be, for example, target ink.

The first inkjet head 118 and the second inkjet head 114 may form the electric wiring structure including the tunnel by performing a printing operation while moving along the trench 155. To form the electric wiring structure, the ink for forming of the tunnel (see 160 of FIG. 5) is first printed in the trench 155 by using the first inkjet head 118, and then the second ink (see 170 of FIG. 6) on the printed first ink 160 by using the second inkjet head 114. Meanwhile, to form the electric wiring structure, the second ink 170 may be first printed in the trench 155 by using the second inkjet head 114, and then the first ink 160 may be printed on the printed second ink 170 by using the first inkjet head 118. Hereinafter, a method of forming an electric wiring using the above-mentioned inkjet printing apparatus 110 will be described in more detail.

FIGS. 2 through 9 illustrate a method of forming an electric wiring using an inkjet printing according to at least one example embodiment.

Figure 2:
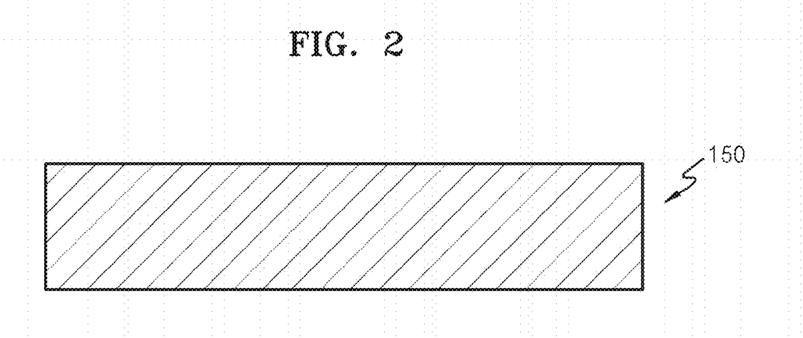
FIGS. 2 through 9 illustrate a method of forming an electric wiring using an inkjet printing according to at least one example embodiment.
Figure 3:
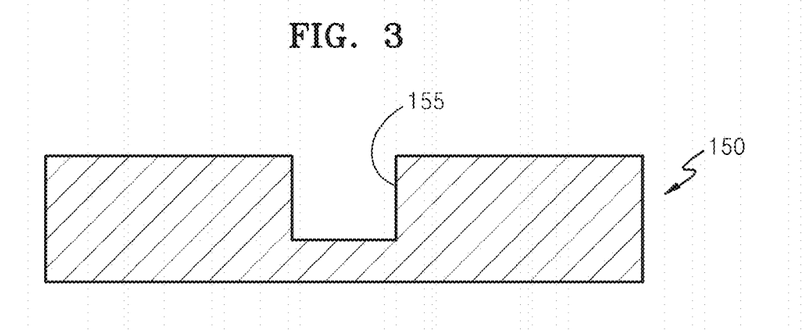
Figure 4:
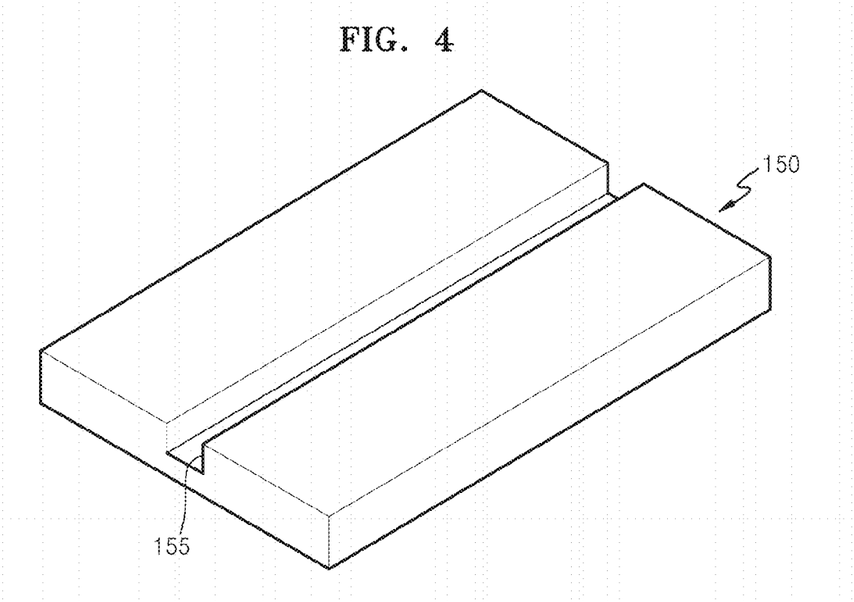

Referring to FIG. 2, a substrate 150 is prepared. The substrate 150 may have a hydrophilic or hydrophobic surface. For example, a glass substrate or a silicon substrate may be used as the substrate 150, however, example embodiments are not limited thereto. Referring to FIG. 3, a trench 155 is formed on the substrate 150. FIG. 4 is a perspective view of the substrate 150 illustrated in FIG. 3. FIG. 4 illustrates that the trench 155 is formed in the shape of a straight line, however, example embodiments are not limited thereto. For example, the trench 155 may be formed to have any desired shape.

The trench 155 may be formed by patterning the substrate 150 by a dry etching using a photolithography method. For example, a photoresist film (not shown) is coated on the substrate 150 and then exposed to light and developed in a desired (or alternatively, predetermined) pattern. Thereafter, the substrate 150 may be dry-etched by using the developed photoresist pattern as an etch mask to form the trench 155 on the substrate 150. Although not illustrated in the drawings, the trench 155 may be formed by coating a desired (or alternatively, predetermined material layer) and patterning the desired (or alternatively, predetermined) material layer by a dry etching using a photolithography method. Meanwhile, after the trench 155 is formed on the substrate 150, the surface of the substrate 150 may be subjected to an ink-phobic treatment.

Figure 5:
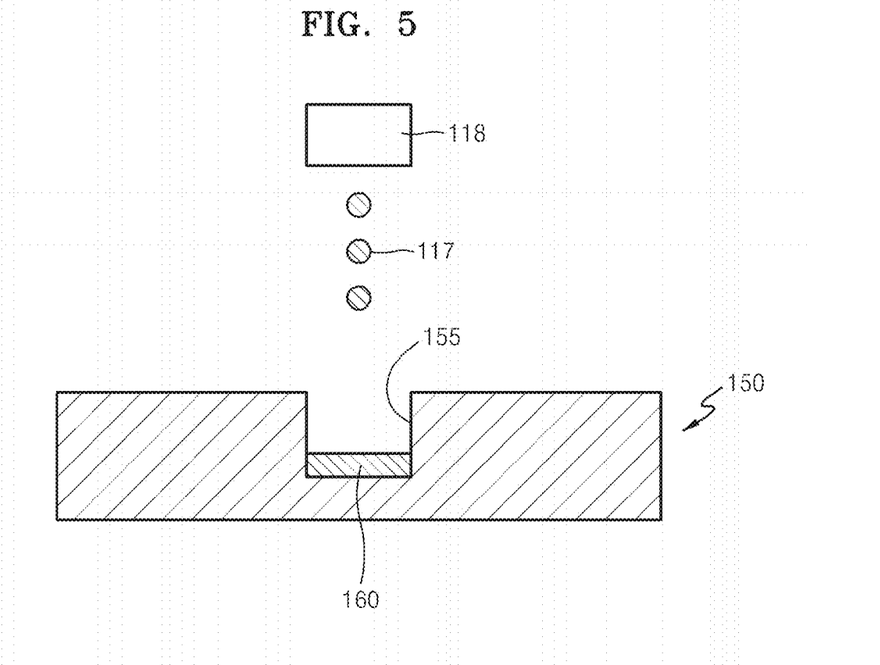

Referring to FIG. 5, the first ink 160 is filled in a lower portion of the trench 155 by ejecting first ink droplets 117, which are used to form the tunnel, from the first inkjet head 118 of the inkjet printing apparatus (see 110 of FIG. 1). According to at least one example embodiment, the first ink 160 may include a solvent that is immiscible with the second ink (see 170 of FIG. 6). The first ink 160 may include a polar or a non-polar solvent. For example, in the case where the second ink 170 includes a polar solvent, the first ink 160 may include a non-polar solvent. In another example, where the second ink 170 includes a non-polar solvent, the first ink 160 may include a polar solvent. For example, the first ink 160 may include a mixture of water and butanol. Also, an evaporation temperature of the first ink 160 may be higher than a sintering start temperature of the second ink 170, and the evaporation temperature of the first ink 160 may be lower than a sintering end temperature of the second ink 170.

Figure 6:
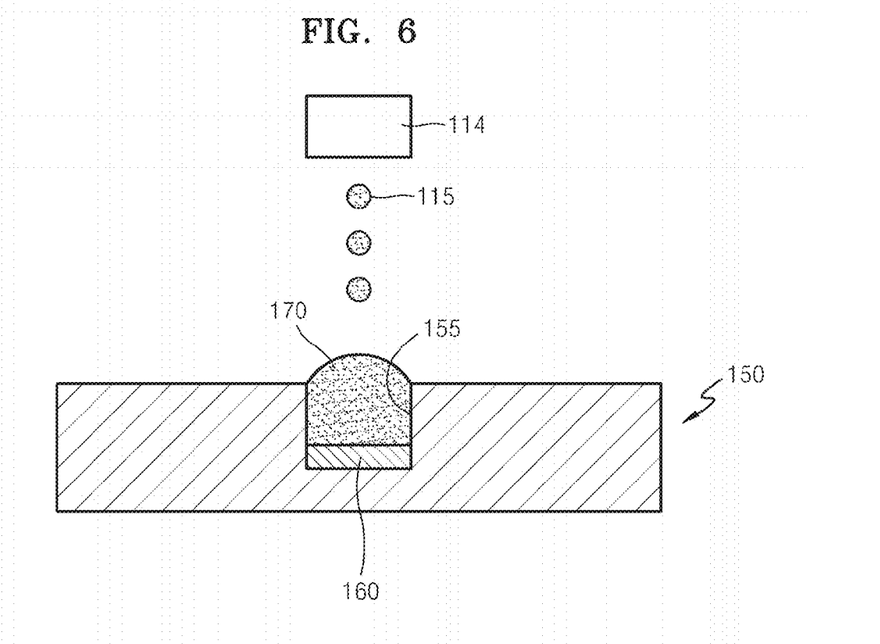

Referring to FIG. 6, the first ink 160 is filled in the lower portion of the trench 155, and then second ink droplets 115 are ejected on the first ink 160 from the second inkjet head 114 of the inkjet printing apparatus 110. Thus, the second ink 170 is filled in the upper portion of the trench 155. As mentioned above, the second ink 170 may include a solvent which is immiscible with the first ink 160. For example, in the case where the first ink 160 includes a polar solvent, the second ink 170 may include a non-polar solvent such as n-tetradecane or the like. In another example, where the first ink 160 includes a non-polar solvent, the second ink 170 may include a polar solvent such as water or the like. The second ink 170 may include a conductive material as a solute. For example, the second ink 170 may include metal nanoparticles. The metal nanoparticles may include, for example, Ag, Au and/or Cu, however, example embodiments are not limited thereto. The metal nanoparticles may include any metal suitable for forming an electric wiring.

Next, a sintering process of the second ink 170 is performed. The sintering process of the second ink 170 may be performed by heating the substrate 150 up to a temperature ranging from about 100° C. to about 500° C. This temperature range is only exemplary, and the sintering temperature of the second ink 170 may be varied according to a desired sintering effect. According to at least one example embodiment, the sintering process of the second ink 170 may include first to third sintering operations. For example, the first sintering operation is a sintering operation during which pores (see 170a of FIG. 7) are generated in the second ink 170 by sintering in a first temperature range and the second ink 170 is adhered to an upper wall of the trench 155. The second sintering operation is a sintering operation during which the first ink 160 filled in the lower portion of the trench 155 is evaporated and then discharged (to an external environment) through the pores generated in the second ink 170. The second sintering operation may be performed in a second temperature range higher than the first temperature range. The third sintering operation is a sintering operation during which the pores 170a generated in the second ink 170 are removed. The third sintering operation may be performed in a third temperature range higher than the second temperature range. These sintering operations will be described in more detail below with reference to the figures.

Figure 7:
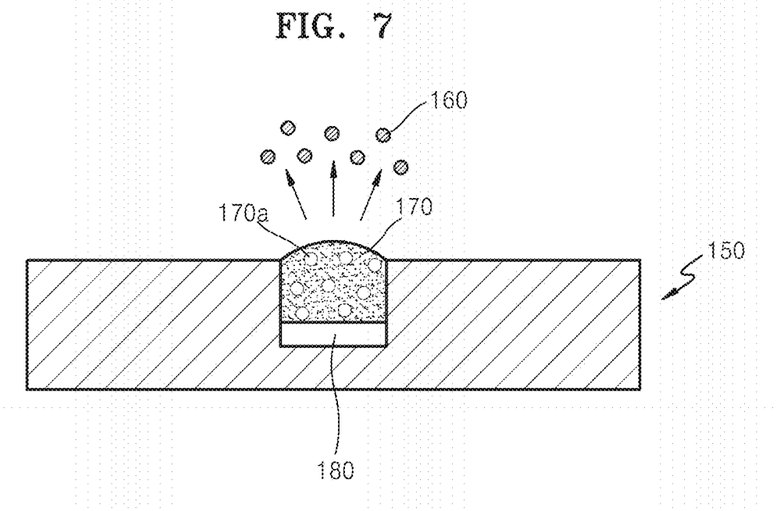

Referring to FIG. 7, in the first sintering operation, the substrate 150 is heated to a desired (or alternatively, predetermined) temperature to start a sintering of the second ink 170. In the first sintering operation, while solvents of the second ink 170 are evaporated, the second ink 170 is contracted and an agglomeration occurs between solute particles of the second ink 170 so that pores 170a are generated in the second ink 170. Through the first sintering operation, the second ink 170 is adhered to an upper wall of the trench 155. Meanwhile, because the first ink 160 filled in the lower portion of the trench 155 has a higher evaporation temperature than a sintering start temperature of the second ink 170, the first ink 160 is not evaporated during the first sintering operation but remains in the lower portion of the trench 155. Next, the sintering temperature of the second ink 170 is elevated to a temperature higher than the evaporation temperature of the first ink 160 to perform the second sintering operation. In the second sintering operation, the first ink 160 filled in the lower portion of the trench 155 is evaporated and then discharged to through the pores 170a generated in the second ink 170, so that a tunnel 180 having a vacant space is formed in the lower portion of the trench 155. Also, as an agglomeration between solute particles of the second ink 170 progresses in the second sintering operation, the size of the pores 170a generated in the second ink 170 increases.

Figure 8:
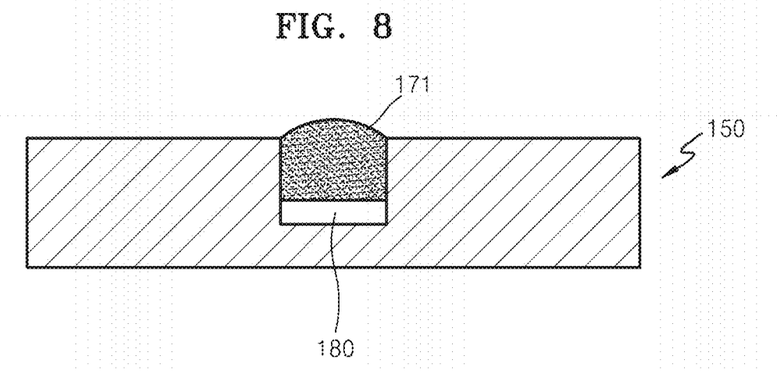
Figure 9:
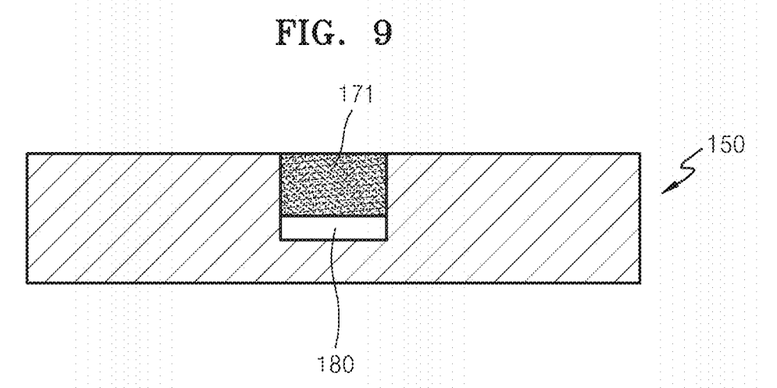

Referring to FIG. 8, the sintering temperature of the second ink 170 is further elevated to perform the third sintering operation. Also, as an agglomeration between solute particles of the second ink 170 further progresses in the third sintering operation, the pores 170a generated in the second ink 170 are released from the second ink 170. Therefore, an electric wiring 171 of a conductive material is formed in the upper portion of the trench 155, and the tunnel 180 is formed under and extends along the electric wiring 171. Meanwhile, after the electric wiring 171 is formed in the upper portion of the trench 155, a process of planarizing a protruded upper surface of the electric wiring 171 may be further performed as illustrated in FIG. 9.

As described above, by evaporating the first ink 160 through the pores 170a generated in the course of sintering of the second ink 170, the electric wiring structure including the tunnel 180 and the electric wiring 171 may be formed in the trench 155. The electric wiring structure may be applied to any desired technology field. For example, the electric wiring 171 may be used in semiconductor memory devices that have an interlayer insulation layer, a device isolation layer, a high dielectric layer, or the like In another example, the electric wiring 171 may be used in a chemical gas sensor device, or the like.

FIGS. 10 through 14 illustrate a method of forming an electric wiring using inkjet printing according to at least one example embodiment. Since the process of preparing a substrate and forming a trench on the substrate has been described with reference to FIGS. 2 through 4, a repetitive description thereof will be omitted.

Figure 10:
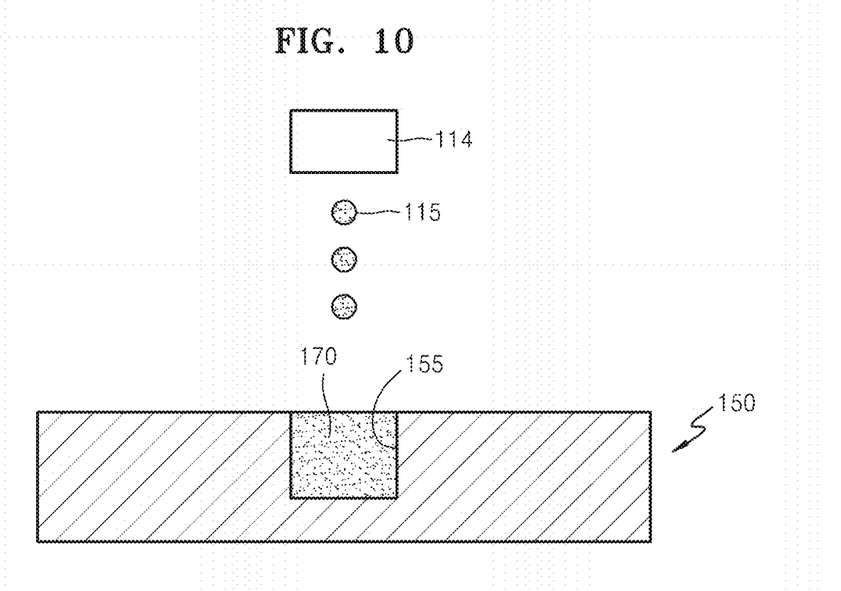
FIGS. 10 through 14 illustrate a method of forming an electric wiring using an inkjet printing according to at least one example embodiment.

Referring to FIG. 10, second ink 170 is filled in a trench 155 by ejecting second ink droplets 115 from the inkjet head 114 of the inkjet printing apparatus (see 110 of FIG. 1). The second ink 170 may include a solvent which is immiscible with the first ink 160. The first ink 160 may be used to form the tunnel. The second ink 170 may include a conductive material as a solute. For example, the second ink 170 may include metal nanoparticles.

Figure 11:
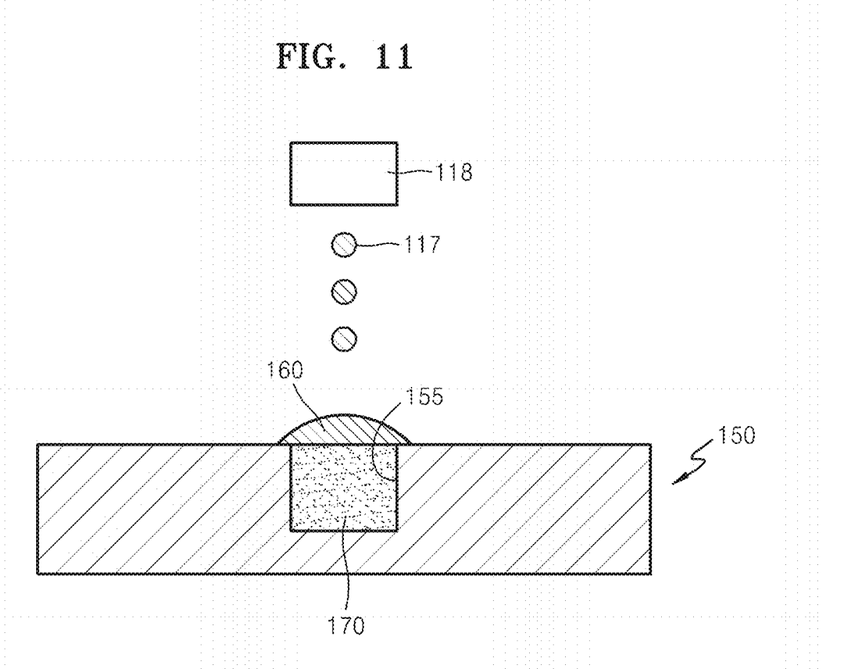

Referring to FIG. 11, first ink 160 ejected on the second ink 170 by ejecting first ink droplets 117 from the first inkjet head 118 of the inkjet printing apparatus 110. The first ink 160 may include a solvent which is immiscible with the second ink 170. The first ink 160 may include a polar or a non-polar solvent. For example, in the case where the second ink 170 includes a polar solvent, the first ink 160 for forming of the tunnel may include a non-polar solvent. In another example, where the second ink 170 includes a non-polar solvent, the first ink 160 may include a polar solvent. Also, an evaporation temperature of the first ink 160 for forming of the tunnel may be higher than a sintering start temperature of the second ink 170, and the evaporation temperature of the first ink 160 may be lower than a sintering end temperature of the second ink 170.

Next, a sintering process of the second ink 170 is performed. The sintering process of the second ink 170 may be performed by heating the substrate 150 up to a temperature ranging from about 100° C. to about 500° C. It should be understood that the above temperature range is only exemplary, and the sintering temperature of the second ink 170 may vary according to a desired sintering effect. The sintering process of the second ink 170 may include first to third sintering operations. According to at least one example embodiment, the first sintering operation is a sintering operation during which pores (see 170a of FIG. 12) are generated in the second ink 170 and the first ink 160 for forming of the tunnel flows down to the lower portion of the trench 155 through the pores 170a. The first sintering operation may be performed in a first temperature range. The second sintering operation is a sintering operation during which the second ink 170 is adhered to an upper wall of the trench 155, the first ink 160 filled in the lower portion of the trench 155 is evaporated and then discharged to through the pores 170a. The second sintering operation may be performed in a second temperature range higher than the first temperature range. The third sintering operation is a sintering operation during which the pores 170a generated in the second ink 170 are removed. The third sintering operation may be performed in a third temperature range higher than the second temperature range. These sintering operations will be described in more detail below with reference to the figures.

Figure 12:
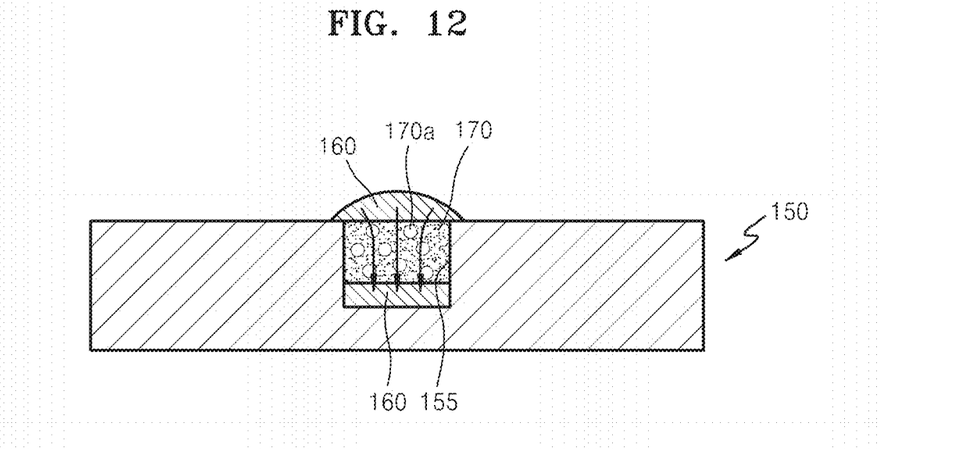

Referring to FIG. 12, the substrate 150 is heated to a desired (or alternatively, predetermined) temperature to start the first sintering operation of the second ink 170. In the first sintering operation, while solvents of the second ink 170 are evaporated, the second ink 170 is contracted and an agglomeration occurs between solute particles of the second ink 170 so that pores 170a are generated in the second ink 170. Because the first ink 160 for forming of the tunnel positioned on the second ink 170 has a higher evaporation temperature than a sintering start temperature, the first ink 160 for forming of the tunnel is not evaporated in the first sintering operation but flows down to the lower portion of the trench 155 through the pores 170a. Accordingly, the second ink 170 which has been subjected to the first sintering operation is positioned at the upper portion of the trench 155.

Figure 13:
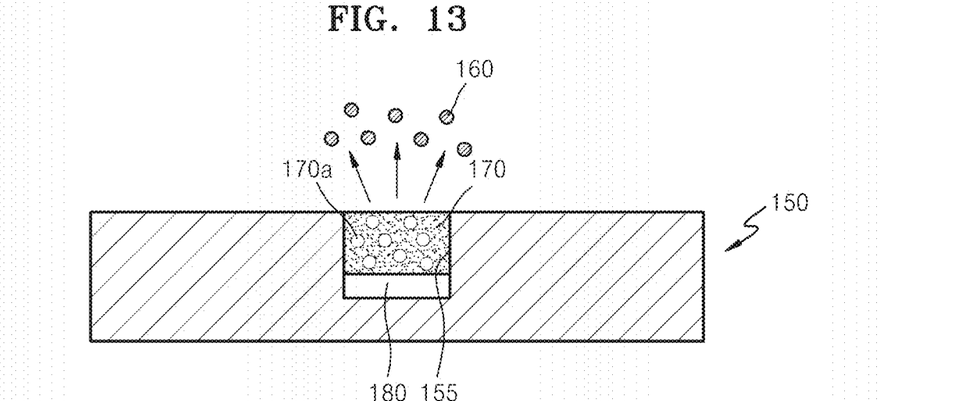

Referring to FIG. 13, the sintering temperature of the second ink 170 is elevated to a temperature higher than the evaporation temperature of the first ink 160 for forming of the tunnel to perform the second sintering operation. In the second sintering operation, as an agglomeration between solute particles of the second ink 170 progresses, the second ink 170 adheres to the upper wall of the trench 155. In addition, the first ink 160 for forming of the tunnel filled in the lower portion of the trench 155 is evaporated and then discharged to an outside through the pores 170a generated in the second ink 170, so that a tunnel 180 having a vacant space is formed in the lower portion of the trench 155. Also, as an agglomeration between solute particles of the second ink 170 progresses in the second sintering operation, the size of the pores 170a generated in the second ink 170 increases.

Figure 14:
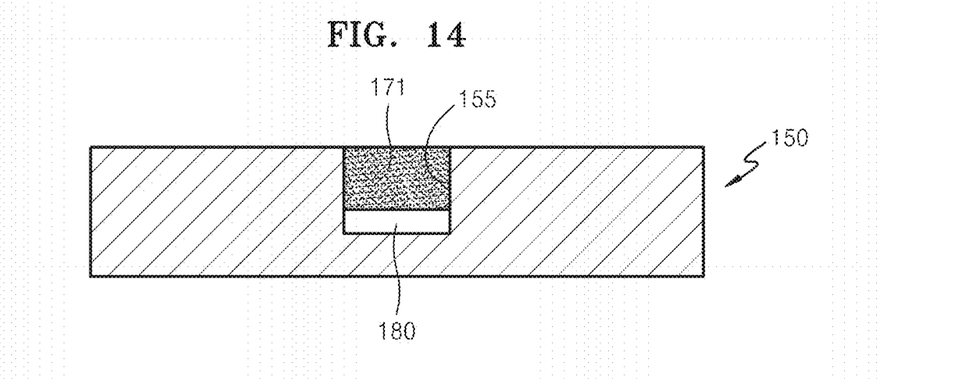

Referring to FIG. 14, the sintering temperature of the second ink 170 is further elevated to perform the third sintering operation. Also, as an agglomeration between solute particles of the second ink 170 further progresses in the third sintering operation, the pores 170a generated in the second ink 170 are released. Therefore, an electric wiring 171 of a conductive material is formed in the upper portion of the trench 155, and the tunnel 180 is formed under and along the electric wiring 171. Meanwhile, after the electric wiring 171 is formed in the upper portion of the trench 155, a process of planarizing a protruded upper surface of the electric wiring 171 may be further performed.

As described above, in the methods of forming the electric wiring according to example embodiments, an electric wiring structure including a tunnel may be formed by evaporating ink for forming of the tunnel through pores generated in the course of sintering. The electric wiring structure may be applied to any desired technology field. For example, the electric wiring 171 may be used in semiconductor memory devices that have an interlayer insulation layer, a device isolation layer, a high dielectric layer, or the like In another example, the electric wiring 171 may be used in a chemical gas sensor device, or the like.

It should be understood that example embodiments described above should be considered in a descriptive sense only and not for purposes of limitation. Descriptions of features or aspects within each example embodiment should typically be considered as available for other similar features or aspects in other example embodiments.

What is claimed is:

1. A method of forming an electric wiring, the method comprising:
    forming a trench on a substrate;
    ejecting first ink and second ink into the trench, the first ink containing a first solvent and the second ink containing a conductive material and a second solvent; and
    heating the substrate to sinter the second ink such that,
        a tunnel is formed in a lower portion of the trench by evaporation of the first ink, and the conductive material forms the electric wiring in an upper portion of the trench, and
    wherein the first solvent of the first ink is immiscible with the second solvent of the second ink, and
    wherein the ejecting of the first ink and the second ink comprises ejecting the first ink in the trench, and ejecting the second ink on the first ink.

2. The method of claim 1, wherein an evaporation temperature of the first ink is higher than a sintering start temperature of the second ink and is lower than a sintering end temperature of the second ink.

3. The method of claim 2, wherein the second ink has a sintering temperature ranging from 100° C. to 500° C.

4. The method of claim 1, wherein the heating the substrate includes,
    a first sintering operation to sinter the second ink such that pores are generated in the second ink and the second ink adheres to an upper wall of the trench, and
    a second sintering operation to sinter the second ink such that the first ink in the lower portion of the trench evaporates and discharges through the pores.

5. The method of claim 4, wherein the heating further includes a third sintering operation to sinter the second ink such that the pores formed in the second ink are removed to form the electric wiring in the upper portion of the trench.

6. The method of claim 1, further comprising:
planarizing an upper surface of the electric wiring after the heating of the substrate.

7. The method of claim 1, wherein the first ink and the second ink are printed by an inkjet printing method.

8. The method of claim 1, wherein the forming the trench includes patterning the substrate by a dry etching using a photolithography method.

9. The method of claim 1, wherein the conductive material comprises metal nanoparticles.

10. The method of claim 1, wherein the lower portion of the trench includes a bottom surface of the trench.

* * * * *